(12) United States Patent
Bauer et al.

(10) Patent No.: US 7,276,785 B2
(45) Date of Patent: Oct. 2, 2007

(54) ELECTRONIC MODULE, PANEL HAVING ELECTRONIC MODULES WHICH ARE TO BE DIVIDED UP, AND PROCESS FOR THE PRODUCTION THEREOF

(75) Inventors: Michael Bauer, Nittendorf (DE); Wolfram Eurskens, Unterhaching (DE); Gerold Gruendler, Regensburg (DE); Rudolf Kerler, Lappersdorf (DE); Heinz Pape, Aschheim (DE); Peter Strobel, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 94 days.

(21) Appl. No.: 10/934,549

(22) Filed: Sep. 7, 2004

(65) Prior Publication Data

US 2005/0052830 A1    Mar. 10, 2005

Related U.S. Application Data

(63) Continuation of application No. PCT/DE03/00729, filed on Mar. 6, 2003.

(30) Foreign Application Priority Data

Mar. 7, 2002    (DE) .................... 102 09 922

(51) Int. Cl.
    *H01L 23/02*    (2006.01)
(52) U.S. Cl. .................... 257/686; 257/777; 257/784

(58) Field of Classification Search ................ 257/685, 257/686, 723–724, 773, 777, 786–787, 790, 257/784, E25.006, E25.013, E25.018, E25.021, 257/E25.027, E25.031, E25.032, E23.042, 257/E23.085, E21.614
See application file for complete search history.

(56) References Cited

U.S. PATENT DOCUMENTS

| 5,877,550 A | 3/1999 | Suzuki |
| 6,211,461 B1 | 4/2001 | Park et al. |
| 6,222,259 B1 | 4/2001 | Park et al. |

FOREIGN PATENT DOCUMENTS

| EP | 0 729 183 A2 | 8/1996 |
| EP | 0 920 058 A2 | 6/1999 |
| EP | 1 030 369 A1 | 8/2000 |

*Primary Examiner*—Hoai Pham
*Assistant Examiner*—DiLinh Nguyen
(74) *Attorney, Agent, or Firm*—Edell, Shapiro & Finnan LLC

(57) ABSTRACT

The invention relates to an electronic module having electronic components, which are arranged in vertically staggered component layers, which are electrically conductively connected to one another via regions, which are uncovered within the respective component layers, of contact bumps or of bonding connections and via interconnects, which are arranged between the component layers and are connected to the uncovered regions. Moreover, the invention relates to a process for producing the electronic module, either in a panel or as individual components.

10 Claims, 6 Drawing Sheets

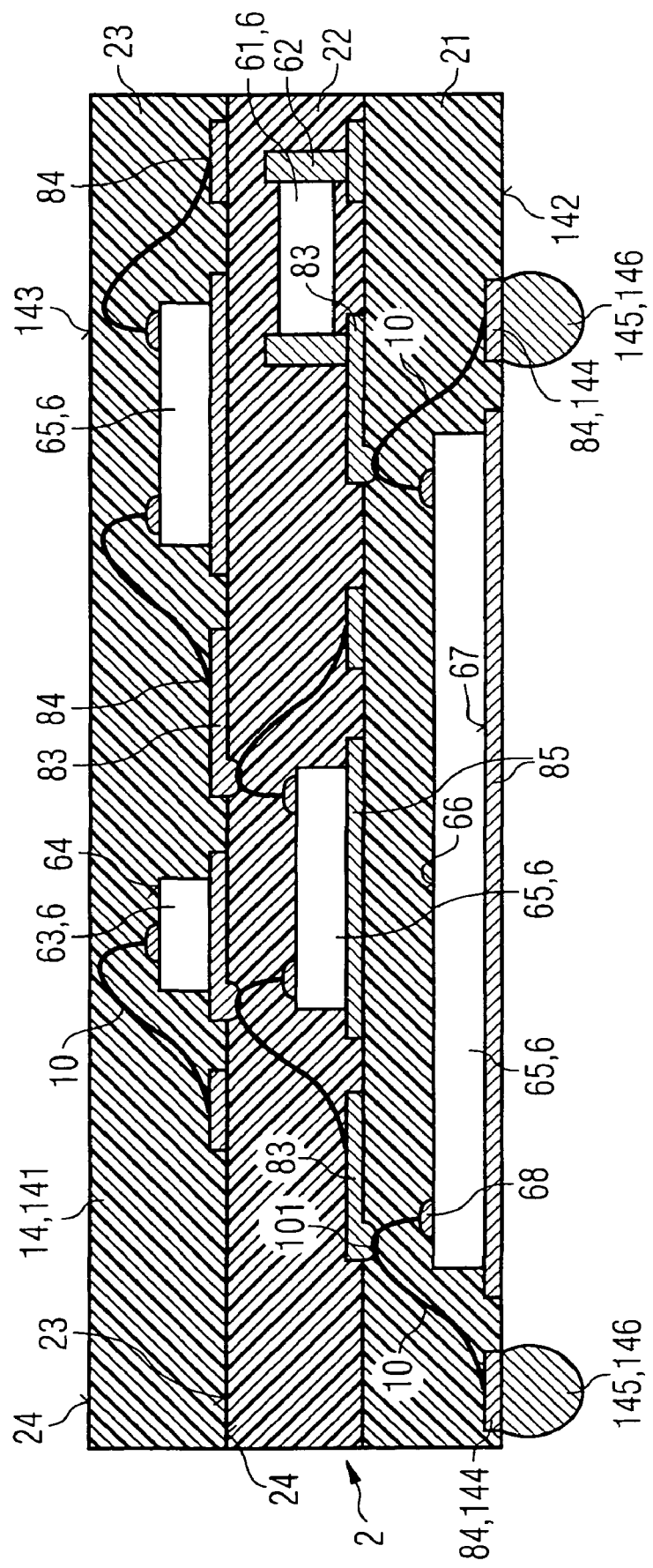

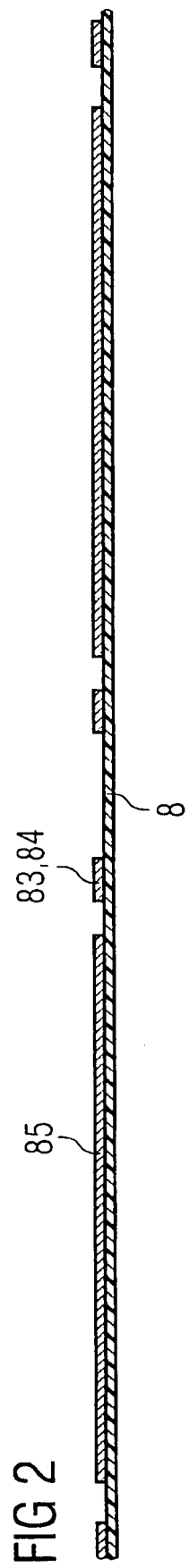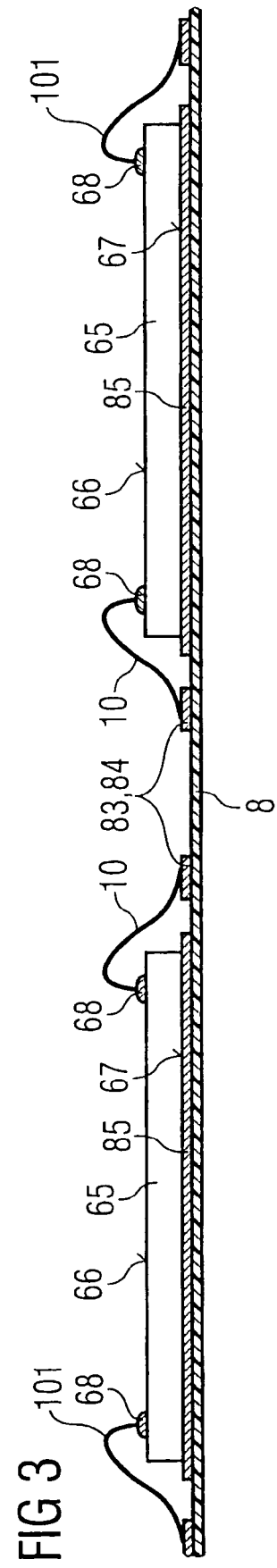

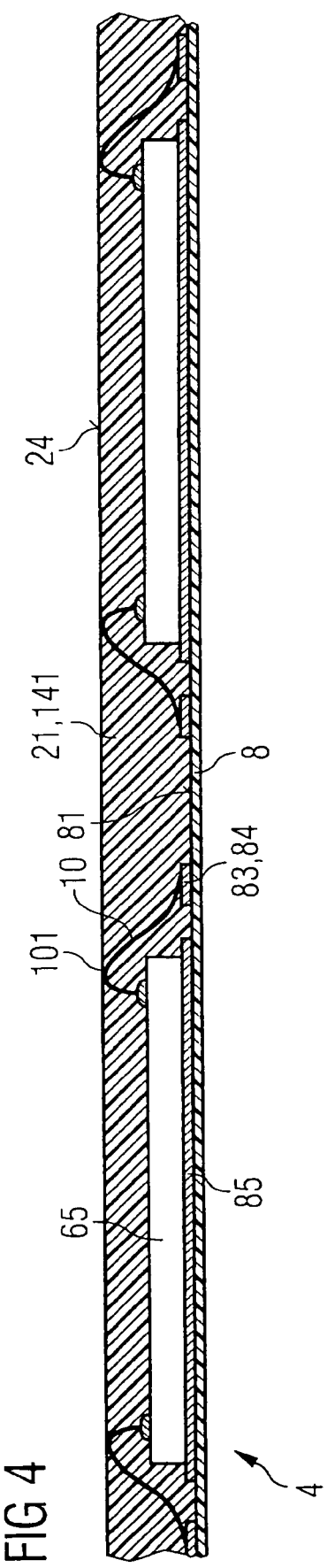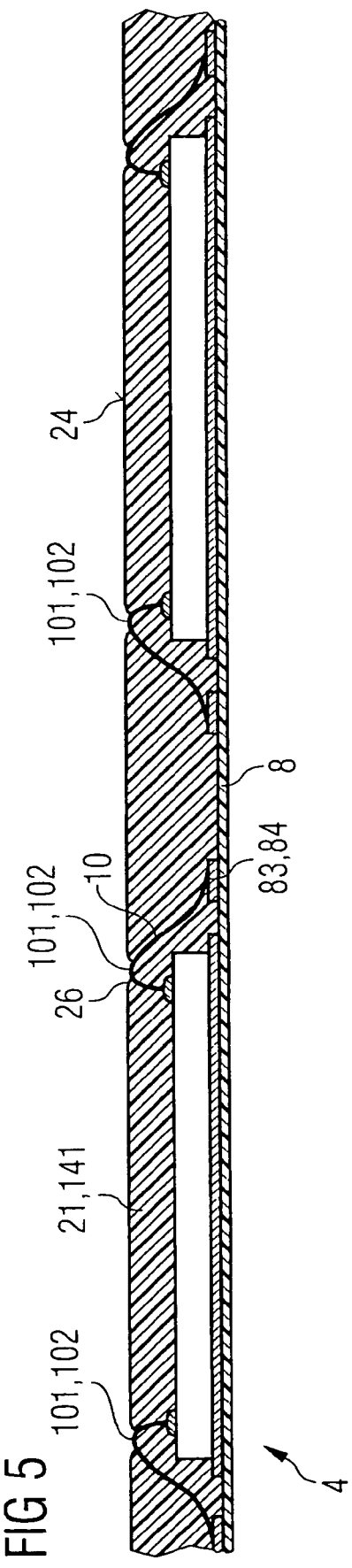

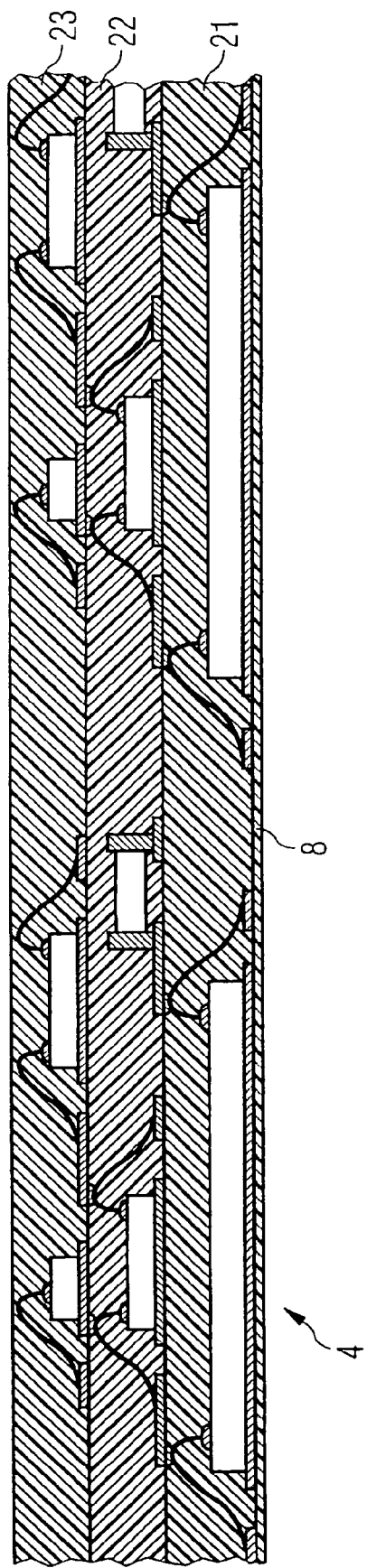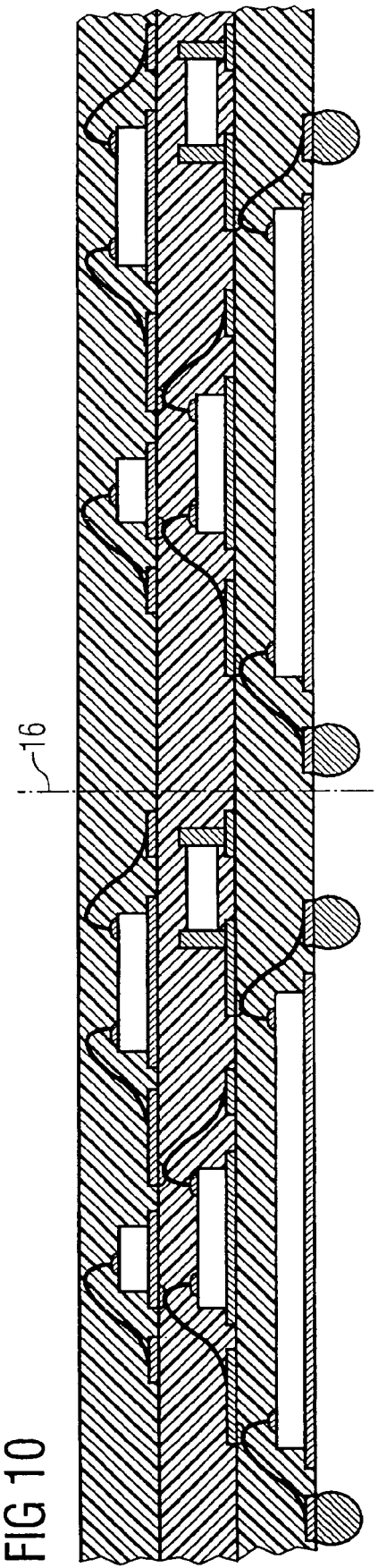

ELECTRONIC MODULE, PANEL HAVING ELECTRONIC MODULES WHICH ARE TO BE DIVIDED UP, AND PROCESS FOR THE PRODUCTION THEREOF

CROSS REFERENCE TO RELATED APPLICATIONS

This application is a continuation of PCT/DE03/00729, filed Mar. 6, 2003, and titled "Electronic Module, Panel with Individual Electronic Modules and Method for the Production Thereof," which claims priority under 35 U.S.C. §119 to German Application No. DE 102 09 922.7, filed on Mar. 7, 2002, and titled "Electronic Module, Panel Having Electronic Modules Which are to be Divided Up, and Process for the Production Thereof," the entire contents of which are hereby incorporated by reference.

FIELD OF THE INVENTION

The invention relates to an electronic module having electronic components, which are arranged in vertically staggered component layers, which are electrically conductively connected to one another via regions, which are uncovered within the respective component layers, of contact bumps or of bonding connections and via interconnects, which are arranged between the component layers and are connected to the uncovered regions. Moreover, the invention relates to a process for producing the electronic module, either in a panel or as individual components.

BACKGROUND

Large-scale integrated electronic modules may have a number of electronic semiconductor components or semiconductor chips and, if appropriate, passive components. These electronic components of the module may be electrically conductively connected to one another in one plane with the aid of a rewiring plate or foil. However, if the electronic module comprises a multiplicity of electronic components, this takes up a relatively large amount of area. It is also possible to construct the components on separate, organic ceramic substrates in multilayer technology for wiring and subsequent encapsulation or coverage with a plastic compound in the form of potting resin or encapsulation compound.

SUMMARY

To provide compact electronic modules, an electronic module having a plurality of electronic components has vertically staggered component layers. In each component layer, there is at least one semiconductor component and/or one semiconductor chip and/or one passive component. These electronic components are electrically conductively connected to one another via regions, which are uncovered within the respective component layers, of first contact bumps and/or of bonding-wire connections and via interconnects, which are arranged between the component layers and are connected to the uncovered regions. An electronic module of this type can have at least two vertically staggered component layers. Each component layer can have a plate-like or disk-like contour.

A structure of this type makes it possible to achieve any desired three-dimensional patterning of electronic modules, which do not require any supporting structures apart from the encapsulating plastic encapsulation compound or the synthetic resin. The structure of modules of this type can be extremely compact compared to a planar rewiring technology, since the rewirings between the components can be configured with a substantial freedom of design in terms of their three-dimensional structure.

According to one configuration of the invention, the component layers each have passive components and/or semiconductor chips and/or semiconductor components embedded in encapsulation compound. As an alternative to an encapsulation compound, it is also possible to use synthetic resin to embed the electronic components.

A molding compound of this type, which is already used in conventional leadframe or BGA housings, serves not only to protect the sensitive electronic components, but also, at the same time, as a substrate for rewiring and for components of a further layer of electronic components. Therefore, each of the component layers serves as a printed circuit board body, produced by injection molding, for the component layer to be constructed on top of it. A three-dimensional arrangement of the active and passive components in virtually any desired number of layers is made possible as a result.

According to a further embodiment of the invention, the electronic module has external contacts on at least one surface. External contacts of this type can be designed, for example, as contact bumps or the like and are used for contact-connection of the electronic module to a higher-level circuit carrier, such as, for example, a printed circuit board. The external contacts are typically located on a housing underside of the module, although the external contacts may in principle be arranged on sides of the housing, in order, for example, to allow further three-dimensional stacking of electronic modules.

In a further embodiment of the invention, an upper bend section, which is uncovered within a component layer, of a bonding-wire connection can be conductively connected to an interconnect of a further component layer. The bonding-wire connections between the contact surfaces of the electronic components and contact terminal surfaces on the respective interconnect level are used not only for contact-connection of the electronic components to the wiring layer on which they are constructed, but also, at the same time, or if appropriate exclusively, as vertical connections between the top side and underside of this mold substrate. The bonding-wire connections can therefore serve as through-contacts, known as vias.

Alternatively, in each case, an upper section, which is uncovered within a component layer, of a first contact bump is conductively connected to an interconnect. As an alternative to the bonding-wire connections, it is also possible to use contact bumps in the form of solder balls or studbumps. These studbumps or solder balls therefore serve to connect the electronic components of a component layer to the interconnects and the electronic components of a following component layer. The vertical electrical connections between component layers by contact bumps can have a greater compactness, compared to bonding-wire connections, since there is no need for any further support for the other end of the bonding wire.

The electronic modules according to the invention can be produced individually or in a panel, as desired. If they are produced in a panel, the modules are divided up from a plate at the end of the production process, for example, by sawing. A panel of this type is typically constructed as a relatively large plate which is divided into rows and columns and is split into individual modules after it has been processed. However, panels in strip form are also possible.

A process according to the invention for producing an electronic module in accordance with one of the embodiments described above can include:

a) providing a flat carrier strip having a metallic patterning applied to a carrier top side, b) applying electronic components to the carrier top side, c) applying first contact bumps and/or wire-bonding connections to contact surfaces of the electronic components, d) embedding the electronic components and the first contact bumps or the wire-bonding connections in an encapsulating compound or in a synthetic resin, so as to produce a first component layer, e) uncovering upper bend sections of the wire-bonding connections and/or upper sections of the first contact bumps, f) applying interconnects to a component layer top side of the first component layer, including the uncovered upper sections, and g) repeating process steps b) to f) one or more times for every further vertically staggered component layer which is followed by a further component layer or process steps b) to d) for a component layer of the electronic module which is located at the top.

With the aid of a process according to the invention of this type, it is possible, in a simple way, to produce large-scale integrated, three-dimensionally patterned electronic modules which have a layered structure with individual interconnect layers arranged between the layers for the rewiring of electronic components embedded within the layers.

An alternative process for producing an electronic module with a plurality of electronic components by dividing them up from a panel provides, as a final, additional process step, for the panel to be divided up into electronic modules by sawing or laser cutting.

With an alternative production process of this type, it is possible to produce a large number of electronic modules in short cycle times, and these modules are then divided up by being sawn into electronic modules. Processing the electronic modules as part of a panel therefore leads to a higher yield within the same processing time.

According to one example of execution of the process according to the invention, the encapsulation compound of the component layers is applied by the transfer molding process. Alternatively, the component layers may also be formed by a synthetic resin which is in each case applied by potting.

According to an exemplary embodiment of the process, the upper bend sections of the bonding-wire connections or the upper sections of the first contact bumps are uncovered by laser ablation. An alternative process provides for these upper bend sections or upper sections to be uncovered by an etching process.

According to a further exemplary embodiment, the interconnects of the rewiring layers between the individual component layers are applied by sputtering on metal over the entire surface, followed by photolithographic patterning and coating by electroplating with a further layer of metal. An alternative exemplary embodiment of the process provides for the interconnects to be applied by mask sputtering of metal followed by coating by electroplating with a further layer of metal.

A further alternative exemplary embodiment of the process according to the invention provides for the interconnects to be produced by patterned application of electrically conductive plastic (nanopaste). This process is also known as dispensing.

The top side of each component layer may be made more suitable for bonding by mechanical roughening or by plasma etching prior to the application of a further component layer.

The individual component layers do not necessarily have to be planar, but rather, if appropriate, may have steps in their height, providing further degrees of freedom in terms of the production of electronic modules that are as compact as possible.

To summarize, the following aspects of the invention result. A molding compound or synthetic resin compound, which is already used in conventional leadframe or BGA housings, in the present case serves not only to protect the electronic components but also, at the same time, as a carrier substrate for a rewiring and further electronic components of a further layer of components. Therefore, each component layer serves as a printed circuit board body produced by injection molding or potting. This allows a three-dimensional arrangement of the active and passive electronic components in any desired number of layers.

Bonding-wire connections are used not only for contact-connection of the components to the respective wiring layer on which they are constructed, but also, at the same time, or if appropriate exclusively, as vertical connections between the top side and underside of the respective mold substrate (component layer). The bonding-wire connections in this case serve as through-contacts, known as vias. Studbumps or other contact bumps, e.g., solder balls, can also be used for upward connection to a further component layer.

A layer of metal, e.g., copper, is sputtered not only onto a component layer located at the top, but also onto the top side of each component layer, which is covered with molding compound. This metal layer is patterned and thickened using standard micro-wiring processes as rewiring. For this purpose, the thin layers of metal, which have been sputtered on, are thickened by electroplating and then etched back. If a metal layer is applied over the entire surface, photolithographic patterning is carried out before or after it is thickened by electroplating with a further metal layer.

The electronic modules can be produced either in a panel, in which case the modules are divided up from a plate at the end of the production process, or are processed individually.

A known, tried-and-tested, lightweight and inexpensive material is used to save on the need for a separate, expensive carrier substrate by a dual function of existing components. A molding compound can provide encapsulation. Bonding wires can serve as vias. Many of the main manufacturing steps have already been introduced.

The structure of the electronic modules is three-dimensional, which allows a high integration density or miniaturization potential to be achieved. Moreover, connections can be made significantly shorter compared to planar modules, which can be applied, in particular, in radiofrequency applications. Finally, disentanglement of a circuit is also simplified if, in addition to the path around a component, it is also possible for a line to be led over or under the component. On the other hand, the construction technology is substantially in layer form, with the molding compound in each case serving as a base for a theoretically unlimited number of rewiring layers. This allows the utilization of known planar techniques and tools.

In individual cases, it is readily possible to deviate from this layered construction technology composed of substantially planar component layers, so that the layer thickness in a component layer may differ. For example, raised sections or depressions can readily be realized for component mounting at different heights within a layer. Compared to a laminar technology, this results in additional degrees of freedom in terms of the three-dimensional design. Alignment marks are also possible, as are roughened or patterned regions for improving the bonding between the individual layers.

By using an encapsulation compound, in the case of organic substrates, the plastics content is relatively high, which is also associated with a high uptake of moisture. This is not the case with the high-density encapsulation compounds typically used, which can result in a reduced sensitivity to soldering shocks.

A flat module housing, produced by injection molding, can be used as a printed circuit board body with a very wide range of types of integrated active and passive components. The standard procedure for the production of electronic modules is substantially reversed, since installation positions of components, wirings and through-contacts are as far as possible produced in advance, and a printed circuit board body subsequently flows around the components and serves as a carrier for the next layer. To solve the particular problem of the production of through-contacts between different layers, the component terminals, i.e., bonding wires, studbumps, etc., have a three-dimensional structure allowing contact-connection between different layers. After components have been applied to and contact-connected on an existing substrate, a molding operation takes place.

The geometry of the terminals and of the mold cavity are matched to one another such that the terminals are uncovered after the molding process or at least are covered by a few micrometers of the molding material. After the molding process, those parts of the component terminals, which are located close to the mold surface, are uncovered and are used for connection of a rewiring, e.g., thin film, screen printing, etc. The surface of the molding material having this rewiring serves as a substrate for building up further components with a subsequent further molding operation. This build-up operation can be repeated as often as desired.

The terminals can be uncovered, for example, by lasers, etching, or grinding. The subsequent rewiring on the mold surface may, for example, be effected by a thin-film technique, i.e., sputtering, photopatterning, thickening by electroplating, etching, a thick-film technique or by dispensing of connection lines, e.g., electrically conductive plastic. The bonding wires or studbumps are therefore used as through-contacts.

Furthermore, additional contact-connections between different layers can be created by integrating bodies produced from any desired dielectric material with metallization regions, which serve as landing points for bonding wires. Therefore, the vertical through-contacts do not necessarily have to be component terminals.

The process described is suitable both for packages in which each individual circuit has its own mold cavity and for packages in which a plurality of circuits with a common mold cavity are produced and are only divided up at the end of mounting.

BRIEF DESCRIPTION OF THE DRAWINGS

The invention will now be explained in more detail on the basis of embodiments and with reference to the appended figures, in which:

FIG. 1 shows an electronic module according to the invention with three vertically staggered component layers, in the form of a diagrammatic cross-sectional illustration.

FIG. 2 shows a diagrammatic cross section through a first process step used in the production of electronic modules according to the invention in a panel.

FIGS. 3 to 5 show successive process steps involved in building up the electronic modules.

FIGS. 9 and 10 show, in successive production steps, in each case an excerpt from a fully processed panel from which a carrier layer has been removed.

DETAILED DESCRIPTION

Figure 6:
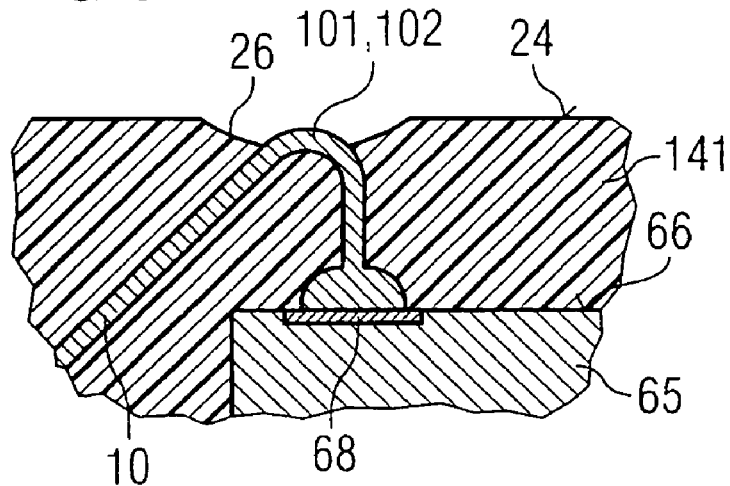
FIG. 6 shows a detailed excerpt from a vertical wiring between two component layers.

FIG. 1 shows an electronic module 2, which includes a plurality of vertically staggered component layers 21, 22, 23 with at least one electronic component 6 in each component layer. The electronic components 6 are electrically conductively connected to one another via regions 102, which are uncovered within the respective component layers 21, 22, 23 of bonding-wire connections 10 and via interconnects 83, which are arranged between the component layers 21, 22, 23 and are connected to the uncovered regions 102.

In the electronic module 2, which is shown in the form of a diagrammatic cross-sectional illustration, for example, in FIG. 1, there are three vertically staggered component layers 21, 22, 23, which each have an encapsulation compound 141 or a synthetic resin in which the electronic components 6 and their bonding-wire connections 10 are embedded.

A semiconductor chip 65 has a passive rear side 67, which is applied to a chip island 85, and can be seen in a first component layer 21. The chip island 85 forms part of a housing underside 142, but may, if appropriate, be covered by encapsulation compound 141 or synthetic resin. Bonding-wire connections 10 lead from contact surfaces 68 on the active chip surface 66, which is on the opposite side from the passive rear side 67, to contact terminal surfaces 84 of interconnects 83 or of external contact surfaces 144. In the exemplary embodiment shown, there are two bonding-wire connections 10, which lead to external contact surfaces 144, to which external contacts 145 are applied in the form of second contact bumps 146. These external contacts 145 or second contact bumps 146 project from the housing underside 142, and, for example, are used for mounting by soldering on a printed circuit board or higher-level circuit carrier of some other form.

The bonding-wire connections 10 each initially run approximately vertically upward from the active chip surface 66, form an upper bend section 101, and then lead onto contact terminal surfaces 84, which are arranged next to the electronic component 6. In terms of dimensioning, the first component layer 21 formed from encapsulation compound 141 is such that the upper bend sections 101 of the bonding-wire connections are still embedded in encapsulation compound 141. However, smaller regions of the bonding-wire connections 10 in the region of the upper bend section 101 are uncovered by laser ablation or by an etching process, resulting in the formation of uncovered regions 102, which are arranged in a shallow hollow, referred to below as a contact hollow 26, in the component layer top side 24 (cf. FIGS. 6 to 8). Interconnects 83 run in a two-dimensional pattern from these uncovered regions 102 of the upper bend sections 101 of the bonding-wire connections 10. The interconnects 83 are each located on the component layer top side 24 and project into a component layer underside 25 of a subsequent second or third component layer 22, 23. In the case of stepped component layers, the interconnects 83 in sections run vertically, so that they run in a three-dimensional pattern.

After a first component layer 21 of this type, as well as the interconnects 83 applied to it, have been completed, it is possible to mount further electronic components 6. In the exemplary embodiment shown, a further semiconductor chip 65, of smaller dimensions than the first semiconductor chip 65, is mounted on a further chip island 85 in a second component layer 22. A passive component 61, which is mounted via small contact legs 62 on corresponding contact terminal surfaces 84 of interconnects 83, is mounted to the right-hand side of the further semiconductor chip 65. There is no need for further contact-connection of the passive component 61 into a third component layer 23 applied above the second component layer 22.

By contrast, the semiconductor chip 65 in the second component layer 22, in turn, has bonding-wire connections 10, which are likewise connected, by an upper bend section 101 and an uncovered region 102 located therein, to interconnects 83 on the component layer top side 24 of the second component layer 22. The component layer top side 24 of the second component layer 22 also has interconnects 83 in a two-dimensional pattern. A third component layer 23, in which electronic components 6 are once again embedded, is applied over the second component layer 22. In the exemplary embodiment shown, the electronic components 6 of the third component layer 23 are indicated as semiconductor components 63 and as further semiconductor chip 65, and these are, in turn, connected, via bonding-wire connections 10, to contact terminal surfaces 84 of interconnects 83 on the component layer top side 24 of the second component layer 22.

In the exemplary embodiment, the third component layer 23 forms the top component layer and its component layer top side 24 forms a housing top side 143. The upper bend sections 101 of the bonding-wire connections 10, which run within component layer 23, do not lead to the outside. Rather, the upper bend sections 101 of the bonding-wire connections 10 are covered by a thin layer of encapsulation compound 141, so that a planar and continuous component layer top side 24 or housing top side 143 is formed.

In principle, virtually any desired number of further component layers can be stacked vertically on top of one another. The maximum height of the electronic module 2 is predetermined by mechanical and production engineering limits.

As an alternative to the bonding-wire connections 10 shown in FIG. 1, it is also possible for the vertical connections between the various component layers to be formed by contact bumps in the form of solder balls (cf. FIG. 11) or studbumps. These structural forms may also be used in combination with one another in a single electronic module, depending on the production engineering options.

The electronic module shown in FIG. 1 may either be produced as an individual component in the form shown or may be obtained by being divided from a larger panel. The successive process steps involved in production by the processing of larger panels is explained in more detail with reference to the following FIGS. 2 to 10.

FIG. 2 shows a diagrammatic cross section through a metallic carrier strip 8, to which further metallic structures in the form of interconnects 83, contact terminal surfaces 84 and of chip islands 85 have been applied. The carrier strip 8 forms the supporting structure for a first component layer 21 to be built on and can be removed in a subsequent process step (cf. FIGS. 9 and 10). The carrier strip 8 may be configured either as an elongate carrier, on which a plurality of electronic modules are built up in succession, or may also be configured as a larger carrier in disk form, on which the electronic modules which are subsequently to be divided up are arranged in rows and columns and can then be sawn up or detached from one another in some other way.

FIG. 3 shows a further partial section through the carrier strip 8 with interconnects 83 or chip islands 85 applied thereto. A passive rear side 67 of a semiconductor chip 65 is applied to each of the two chip islands 85 shown. An active chip surface 66 of each semiconductor chip 65, which is on the opposite side from the passive rear side 67, has contact surfaces 68, which are each electrically conductively connected, via bonding-wire connections 10, to contact terminal surfaces 84 on the interconnects 83. The three-dimensional geometric configuration of the bonding-wire connections 10 can have a high degree of accuracy, since the height of an upper bend section 101 of each bonding-wire connection 10 can extend as far as a component layer top side 24 of the respective component layer. Moreover, the positioning of the upper bend section 101 can be accurately defined for the laser ablation or selective etching or grinding.

FIG. 4 shows a further partial section through a panel 4 including a plurality of electronic modules, which are to be divided up. In this case, an encapsulation compound 141, which surrounds the semiconductor chips 65 and the bonding-wire connections 10, is applied to a top side 81 of the carrier strip 8. The upper bend sections 101 of the bonding-wire connections 10 may either project out of the component layer top side 24 to a minimal extent or may be completely covered thereby. As an alternative to an encapsulation compound 141, which is applied by transfer molding, it is also possible for the components to be potted in a synthetic resin.

FIG. 5 shows a partial cross section through the panel 4, in which the upper bend sections of the bonding-wire connections have been uncovered such that the upper bend sections project from the component layer top side 24 of the first component layer 21. This upper bend section 101, therefore, has an uncovered region 102, which is arranged in a contact hollow 26.

FIG. 6 shows a detailed excerpt of this situation, clearly revealing the contact hollow 26 and the uncovered region 102 of the upper bend section 101 of the bonding-wire connection 10 projecting out of it. The contact hollow 26 has the form of a shallow depression, which may be produced, for example, by a laser ablation process or by punctiform etching. Alternatively, the contact hollow 26 may also be realized by partially grinding away the component layer top side 24.

Figure 7:
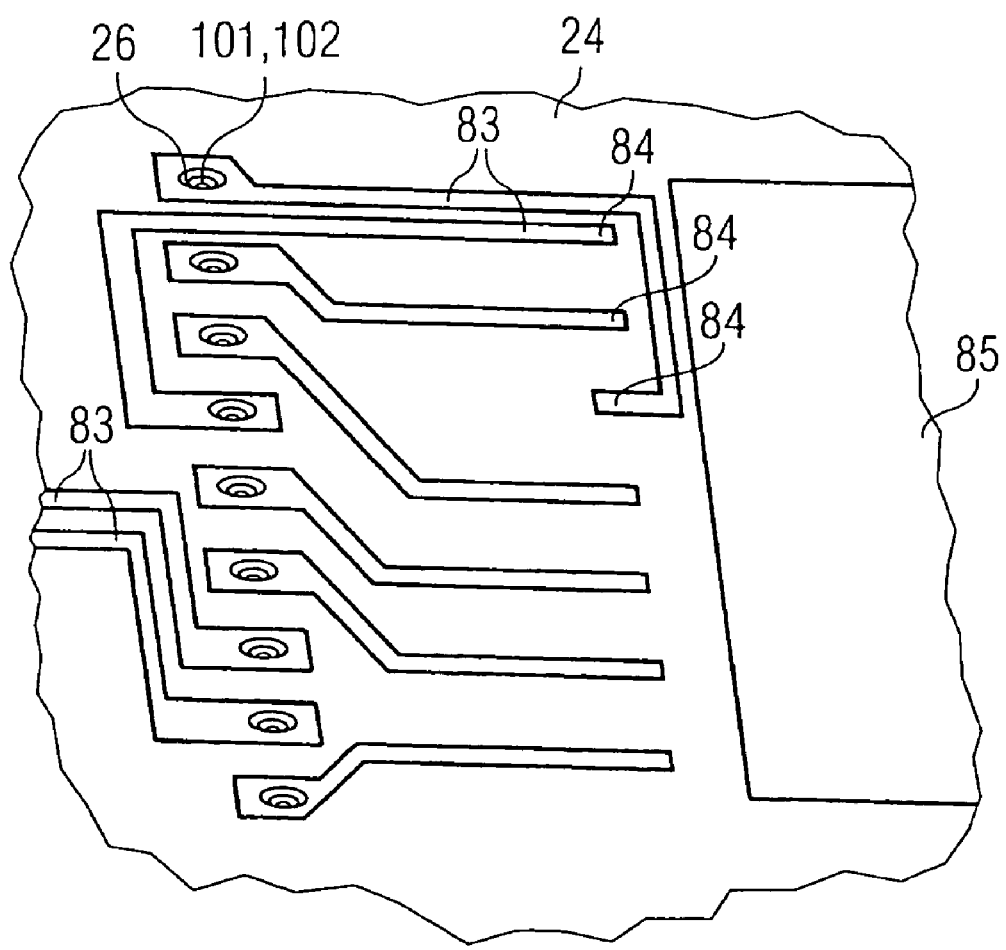
FIG. 7 shows an inclined, perspective view of an excerpt from a rewiring level comprising interconnects on a component layer top side.

FIG. 7 shows an inclined view of the component layer top side 24 with interconnects 83 applied to it and with part of a chip island 85. The interconnects 83 are used for the rewiring of the upper bend sections 101 of the bonding-wire connections 10 to further contact terminal surfaces 84 on the component layer top side 24. The interconnects 83 allow a freedom of design in terms of the line routing which would not be feasible using conventional vias.

Most interconnects 83 end on one side in a contact hollow 26, which they completely fill, producing intimate electrically conductive contact with the uncovered region 102 of each bend section 101. In each case, the other end of most of the interconnects 83 is configured as a contact terminal surface 84 for contact-connection to an end of a bonding-wire connection 10 to an electronic component 6. To produce pure through-contacts, it is possible for individual interconnects 83 to be provided without connection to electronic components 6. In this case, the interconnects can serve as contact-connection to bonding wires.

The interconnects 83 and the chip islands 85 can be produced either by sputtering on a thin layer of metal, for example, aluminum, over the entire surface, with subsequent photolithographic patterning of the desired interconnect structures, or by mask sputtering of metal. In this technique, known as thin-film technology, the metallic surface is then thickened further by electroplating processes. Finally, a thin layer is removed again by etching.

The interconnects 83 and the chip islands 85 may alternatively be produced by means of a thick-film technique or also, for example, by the application of connection lines in the form of electrically conductive plastic, known as nano-pastes. The latter process is also known as dispensing.

Figure 8:
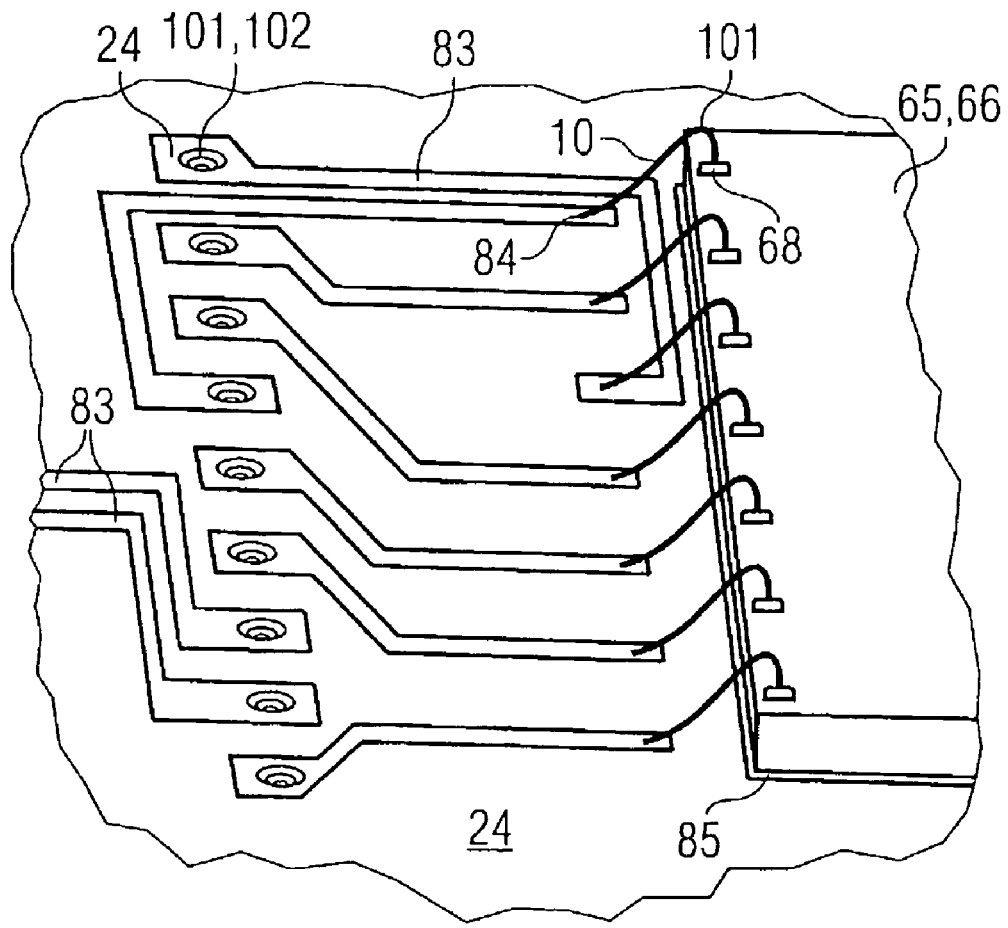
FIG. 8 shows a further perspective, inclined view of the rewiring level corresponding to FIG. 7, with a semiconductor chip applied to a chip island.

FIG. 8 shows a further inclined view, in which a semiconductor chip 65 has been applied to the chip island 85. Bonding-wire connections lead from the contact surfaces 68 on the active chip surface 66 to the contact terminal surfaces 84 of the inter-connects 83, producing an electrically conductive connection from the contacts of the semiconductor chip 65 to the contacts of the electronic components arranged below.

FIG. 9 shows a fully processed panel 4 in the form of a partial cross section, from which the individual electronic modules 2 can be obtained by sawing. In the exemplary embodiment shown, the panel 4 has just three component layers 21, 22, 23, but depending on the requirements and the manufacturing technology options, may also have a significantly greater number of component layers.

The electrical connections between the successive component layers are produced by upper bend sections 101 of bonding-wire connections 10 and interconnects 83 of a component layer arranged above, which are connected to these upper bend sections 101. As can readily be seen from FIGS. 8 and 9, the electronic components 6 can be arranged in virtually any desired way, leading to a high degree of flexibility in terms of electronic modules which can be realized thereby.

After the panel 4 has been provided with a top component layer, from which no further upper bend sections of bonding-wire connections 10 project, it is possible to remove the carrier strip 8 (FIG. 9). In the case of a metallic carrier strip 8, this is, for example, done by etching, with the result that external contact surfaces 144 on a housing underside 142 of the housing 14 are uncovered. These external contact surfaces 144 can then be provided with external contacts 145, for example, in the form of second contact bumps 146 as shown in FIG. 10. Finally, the panel 4 can be divided up into individual electronic modules 2 along the sawing tracks 16. This can be done, for example, by sawing or by laser cutting. This division produces electronic modules 2 as illustrated in FIG. 1 and as have already been explained above.

Figure 11:
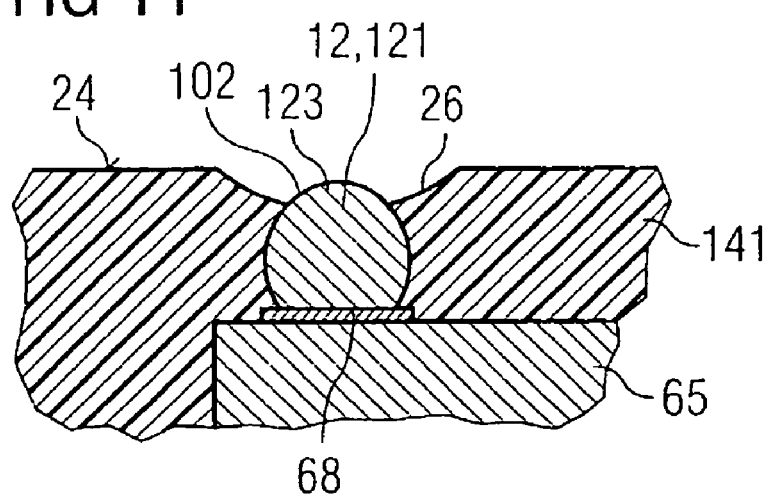
FIG. 11 shows a detailed excerpt from an alternative vertical connection between two adjacent component layers.

FIG. 11 shows a further detailed cross section through an alternative configuration of the through-contacts from one component layer to the next. In this case, first contact bumps 12 in the form of solder balls 121 have been applied to the contact surfaces 68 of the electronic components, in the exemplary embodiment shown a semiconductor chip 65. These first contact bumps 12 are initially also completely surrounded by encapsulation compound 141, so that an upper section 123 of the first contact bumps 12 also does not project out of the component layer top side 24. A contact hollow 26 is once again formed around the contact bump 12 by etching, grinding or laser ablation processes, producing an uncovered region 102 of the first contact bump 12. The contact hollow 26 and the uncovered region 102 of the upper section 123 of the contact bump 12 can then be provided with a metallization in the same way as shown in FIG. 8.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

We claim:

1. An electronic module, comprising:
   at least two vertically staggered component layers, each component layer comprising:
   a component comprising at least one or more of: a semiconductor component a semiconductor chip and a passive component;
   contact bumps on said component and bonding wire connections that connect to said contact bumps at one end, wherein said bonding wire connections comprise an upper bend section;
   an encapsulation material that embeds said at least one component, said contact bumps and said wire bonding connections in such a manner so as to leave a portion of the bonding wire connections uncovered at regions on a surface of the component layer; and
   an interconnect disposed on the surface of the component layer in a two-dimensional pattern and making electrical contact with said wire bonding connections at said regions, wherein said interconnect projects upwards into an adjoining component layer to make electrical connection with said adjoining component layer;
   wherein said upper bend section of the wire bonding connections corresponds to the portion of the bonding wire connections that are uncovered at said regions and which make electrical connection to an interconnect of the corresponding component layer.

2. The electronic module as claimed in claim 1, wherein each component layer has a plate-like or disk-like contour.

3. The electronic module as claimed in claim 1, wherein the encapsulation material is synthetic resin.

4. The electronic module as claimed in claim 1, wherein the electronic module has external contacts on at least one surface.

5. The electronic module as claimed in claim 4, wherein the external contacts are provided on a housing underside of the electronic module.

6. The electronic module as claimed in claim 1, wherein at least some of the contact bumps are formed as solder balls.

7. The electronic module as claimed in claim 1, wherein at least some of the contact bumps are formed as stud bumps.

8. A panel, comprising a plurality of electronic modules according to claim 1, wherein the plurality of electronic modules are arranged in rows and columns, the electronic modules each having a plurality of electronic components.

9. The panel as claimed in claim 8, wherein all of the contact bumps are formed as solder balls.

10. The panel as claimed in claim 8, wherein all of the contact bumps are formed as stud bumps.

* * * * *